United States Patent
Kumar et al.

(10) Patent No.: US 12,477,685 B2
(45) Date of Patent: Nov. 18, 2025

(54) SERVER COOLING USING SPRAYED FLUID AND HIGH CONDUCTIVITY GAS OR AIR

(71) Applicant: Microsoft Technology Licensing, LLC, Redmond, WA (US)

(72) Inventors: Hariharan Kumar, Sammamish, WA (US); Husam Atallah Alissa, Snoqualmie, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 271 days.

(21) Appl. No.: 18/315,300

(22) Filed: May 10, 2023

(65) Prior Publication Data

US 2024/0381571 A1    Nov. 14, 2024

(51) Int. Cl.
*H05K 7/20* (2006.01)

(52) U.S. Cl.
CPC ..... *H05K 7/20272* (2013.01); *H05K 7/20772* (2013.01)

(58) Field of Classification Search
CPC ........... H05K 7/20272; H05K 7/20772; H05K 7/20754; H05K 7/20781; H05K 7/20345; G06F 1/20
See application file for complete search history.

(56) References Cited

U.S. PATENT DOCUMENTS

| | | | | |
|---|---|---|---|---|
| 5,761,035 A | * | 6/1998 | Beise | H05K 7/20345 174/15.1 |
| 5,907,473 A | * | 5/1999 | Przilas | H05K 7/20345 174/15.1 |
| 6,139,361 A | * | 10/2000 | Przilas | H05K 7/20345 439/559 |
| 7,495,914 B2 | * | 2/2009 | Tilton | H01L 23/4735 361/689 |
| 7,522,417 B2 | * | 4/2009 | Pautsch | H05K 7/20345 361/689 |
| 9,445,531 B1 | * | 9/2016 | Heydari | H05K 7/20836 |
| 9,713,290 B2 | * | 7/2017 | James | H05K 7/20809 |
| 10,018,425 B2 | * | 7/2018 | Shelnutt | G06F 1/20 |
| 10,156,402 B1 | * | 12/2018 | Carlson | H01L 23/427 |
| 10,426,062 B1 | * | 9/2019 | Saunders | H05K 7/1497 |
| 10,433,459 B2 | * | 10/2019 | Wang | H05K 7/20345 |
| 11,581,243 B2 | * | 2/2023 | Hinton | H05K 7/20345 |

(Continued)

FOREIGN PATENT DOCUMENTS

| | | |
|---|---|---|
| DE | 69732256 T2 | 12/2005 |
| EP | 3874923 A1 | 9/2021 |

OTHER PUBLICATIONS

International Search Report and Written Opinion received for PCT Application No. PCT/US2024/028079, Sep. 3, 2024, 15 pages.

(Continued)

*Primary Examiner* — Lisa Lea-Edmonds
(74) *Attorney, Agent, or Firm* — ArentFox Schiff LLP

(57) ABSTRACT

Described are examples for improving heat transfer for a data center, which may include a hermetically sealed container having sides defining an interior portion that is able to hold pressurized gas or air, a data center computer server located within the interior portion, and a spray device located within the interior portion for spraying a non-corrosive fluid over the data center computer server to, in conjunction with the pressurized gas or air, cool at least a portion of the data center computer server.

17 Claims, 5 Drawing Sheets

(56) References Cited

U.S. PATENT DOCUMENTS

| | | | |
|---|---|---|---|
| 11,903,166 B2* | 2/2024 | Peterson | H05K 7/20818 |
| 12,156,371 B2* | 11/2024 | Clerc | H05K 7/20781 |
| 2007/0183125 A1* | 8/2007 | Tilton | H01L 23/4735 361/699 |
| 2007/0230126 A1* | 10/2007 | Pautsch | H05K 7/20345 361/699 |
| 2010/0039773 A1* | 2/2010 | Tilton | H05K 7/20345 361/699 |
| 2015/0382515 A1* | 12/2015 | James | H05K 7/20327 361/679.47 |
| 2018/0368281 A1* | 12/2018 | Wang | H05K 7/20345 |
| 2019/0320553 A1* | 10/2019 | Saunders | H05K 7/1497 |
| 2020/0105645 A1* | 4/2020 | Mydlarski | H01L 23/4735 |
| 2024/0138112 A1* | 4/2024 | Peterson | H05K 7/20327 |
| 2024/0260228 A1* | 8/2024 | Chuang | H05K 7/20818 |
| 2024/0381571 A1* | 11/2024 | Kumar | G06F 1/20 |

OTHER PUBLICATIONS

"Immersion Cooling for Data Centers", Retrieved From: https://www.3m.com/3M/en_US/data-center-us/applications/immersion-cooling/, Retrieved Date: Dec. 27, 2022, 7 Pages.

"Shell Immersion Cooling Fluids", Retrieved From: https://www.shell.com/business-customers/lubricants-for-business/process-oils/immersion-cooling-fluids.html, Retrieved Date: Dec. 27, 2022, 10 Pages.

* cited by examiner

SERVER COOLING USING SPRAYED FLUID AND HIGH CONDUCTIVITY GAS OR AIR

BACKGROUND

Data center equipment, such as data center computer servers, server racks, etc., can generate substantial amounts of heat that need to be removed to maintain operating temperatures within prescribed limits. The data center computer servers can be equipped with one or more fans positioned at the rear of the server that operate to pull cool air through air intakes in the front of the server, which cools the components of the server, and push the air through an exhaust at the rear of the server. Use of such fans also requires a sheet metal enclosure for the server, which may require certain specifications or thickness to effectuate the air cooling, complicated hardware designs to fit within the enclosure and be effectively cooled, etc. In addition, the fans require power to operate, which can become a significant power draw when multiple servers, racks of servers, etc. are in parallel operation.

Other cooling designs have been developed including immersion cooling where an entire rack of data center computer servers are submerged in a tank of immersion cooling fluid. Single-phase immersion cooling includes a fluid cooling system that pumps cool fluid into the bottom of the tank, pulls heated fluid from the top of the tank, and cools the heated fluid for pumping back into the bottom of the tank. Two-phase immersion cooling includes a condenser for condensing vapor that rises to the top of the tank as the fluid boils, and transfers the heat out of the system. With immersion cooling, the fluid tank can be costly and cumbersome to install. In addition, server replacement may require significant work, such as draining the tank, replacing the server, refilling the tank, etc.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an example, a system for improving heat transfer for a data center is provided that includes a hermetically sealed container having sides defining an interior portion that is able to hold pressurized gas or air, a data center computer server located within the interior portion, and a spray device located within the interior portion for spraying a non-corrosive fluid over the data center computer server to, in conjunction with the pressurized gas or air, cool at least a portion of the data center computer server.

In another example, a method for improving heat transfer for a data center is provided that includes spraying, via a spray device, an interior portion of a hermetically sealed container that houses a data center computer server with a non-corrosive fluid to, in conjunction with pressurized gas or air, cool at least a portion of the data center computer server, collecting the non-corrosive fluid that has cooled the data center computer server, and recirculating the non-corrosive fluid to the spray device.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
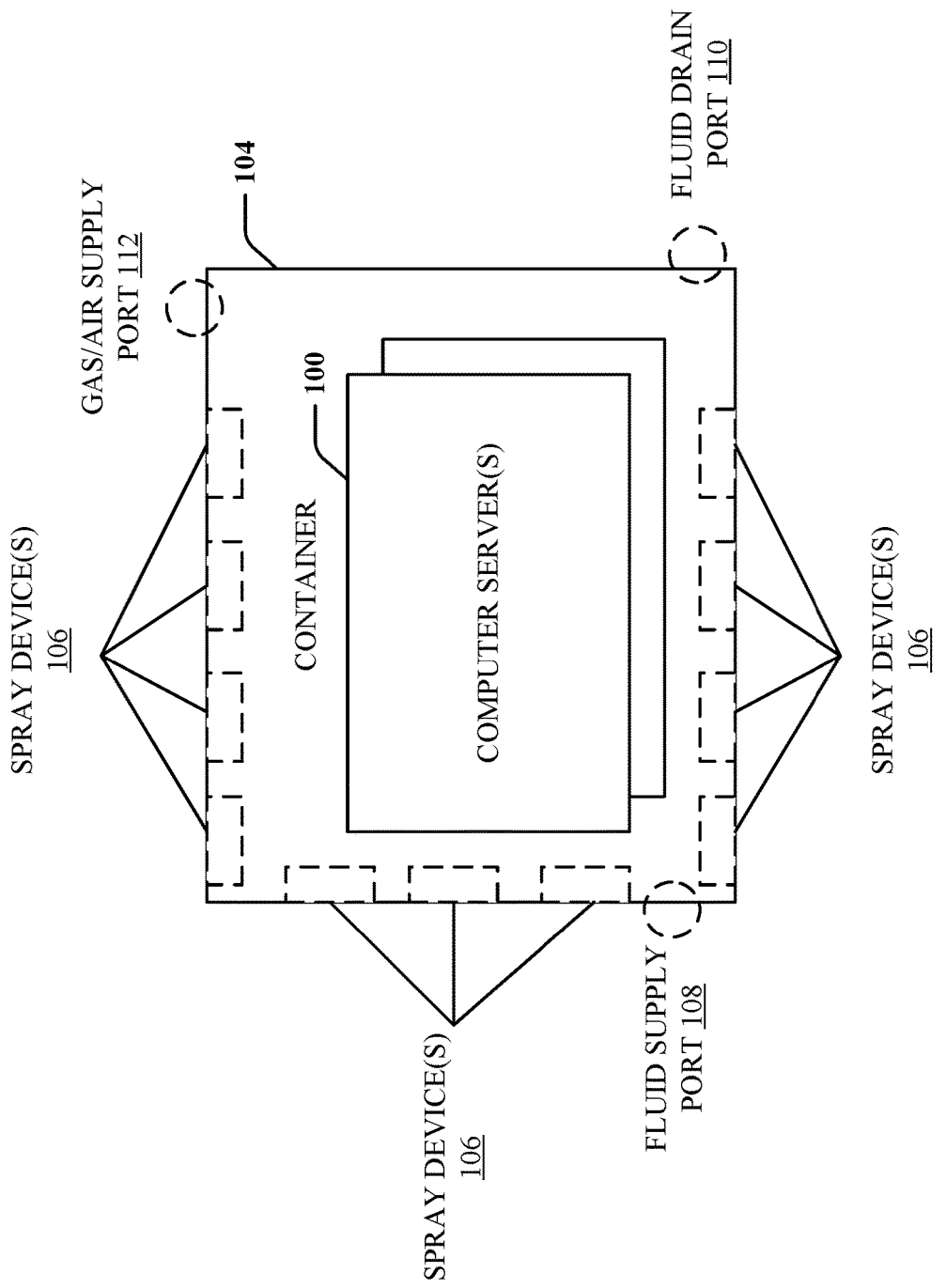
FIG. 1 is a high-level block diagram of an example of one or more computer servers within a container, in accordance with aspects described herein.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known components are shown in block diagram form in order to avoid obscuring such concepts.

This disclosure describes various examples related to a cooling method or system for improving heat transfer for a data center. For example, a spraying device, such as a sprinkler or other device that can spray fluid, can be used to spray non-corrosive fluid over a data center computer server to cool the server. In an example, the spraying device can be used in conjunction with a pressurized gas or air system to effectuate cooling of the server, where the pressurized gas or air compound and the fluid compound do not produce a chemical reaction. The fluid can be collected once it has cooled the server, circulated, and/or cooled, and then can be provided back to the spraying device for continuing to spray the server.

For example, the data center computer server (or multiple servers, such as a rack of servers, a cluster of racks, etc.) can be located in a hermetically sealed container that can seal to prevent pressurized gas or air from escaping the container. In one example, the spraying device can spray the pressurized gas or air along with the fluid (e.g., as a mixture, in phases, etc.). In another example, a separate device or system can be used to provide the pressurized gas or air within the hermetically sealed container. As used herein, the phrase "hermetically sealed" may refer to any seal that prevents the high pressure gas from escaping a container.

Using this cooling can eliminate the exhaust fans in current server designs, which can decrease accompanying noise caused by the fans, reduce power consumed by operating the fans (which can be around 5% of the server power consumption for each server), and can reduce or eliminate the metal enclosure for each server. All these reductions also have a cost reduction element for the servers. Removal of the metal enclosure can also reduce the carbon footprint and the weight of the server. Reduction in weight and/or size of the servers, in this regard, can allow for adding servers based on other design considerations (e.g., height, power limits, etc.). In addition, using the cooling described herein can allow for improved or simplified or more modular serviceability for the servers, as compared to full immersion of the servers in tanks of fluid. Other advantages can include more intuitive container designs for servers that do not need to account for fans or air flow via fans, such as container designs to support different hardware configurations, such as central processing units (CPUs), graphic processing units (GPUs), hard disk drives (HDDs), solid state drives (SSDs), or highly mixed components, etc.

Figure 2:
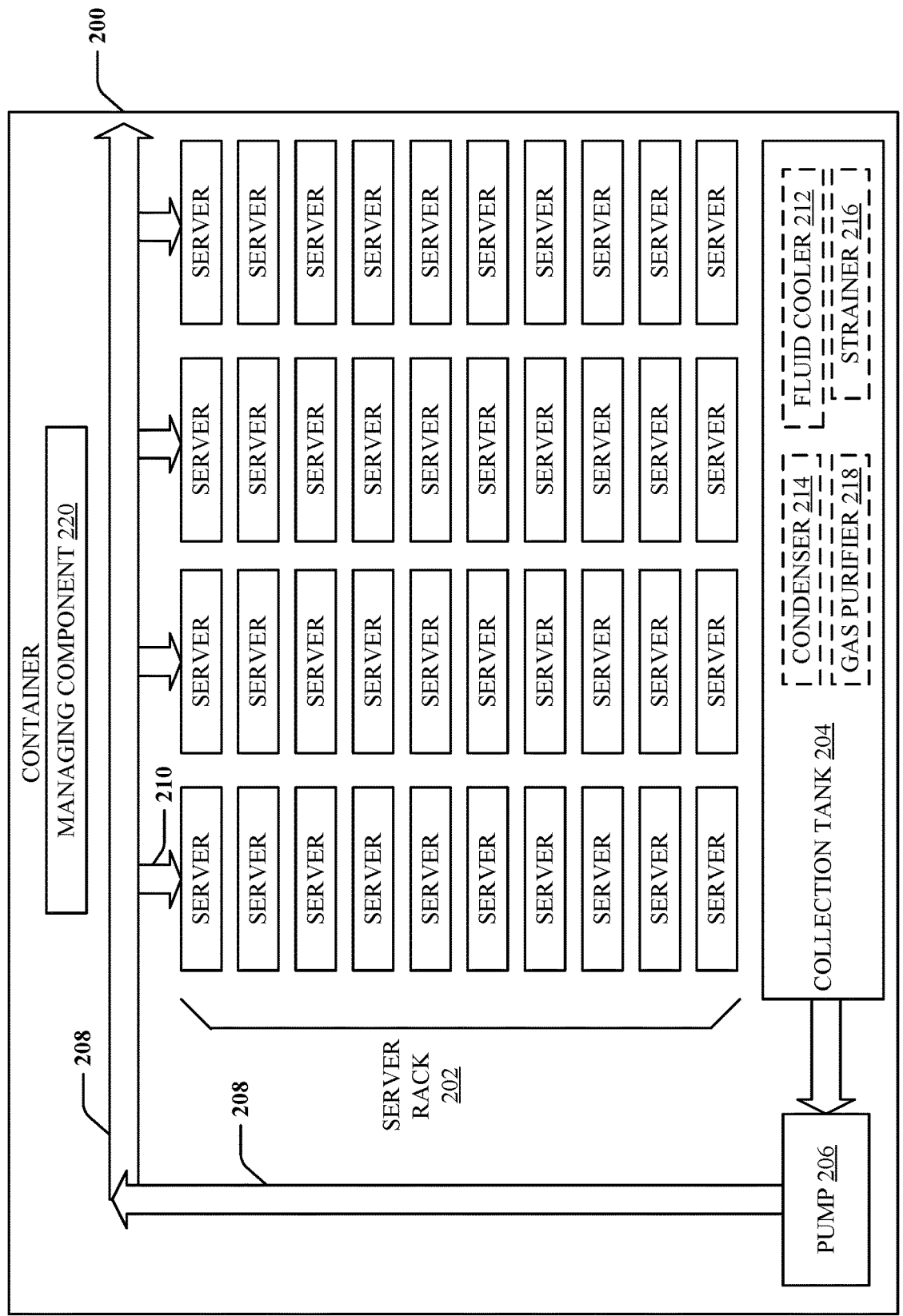
FIG. 2 is a high-level block diagram of an example of a container that houses one or more server racks, in accordance with aspects described herein.
Figure 3:
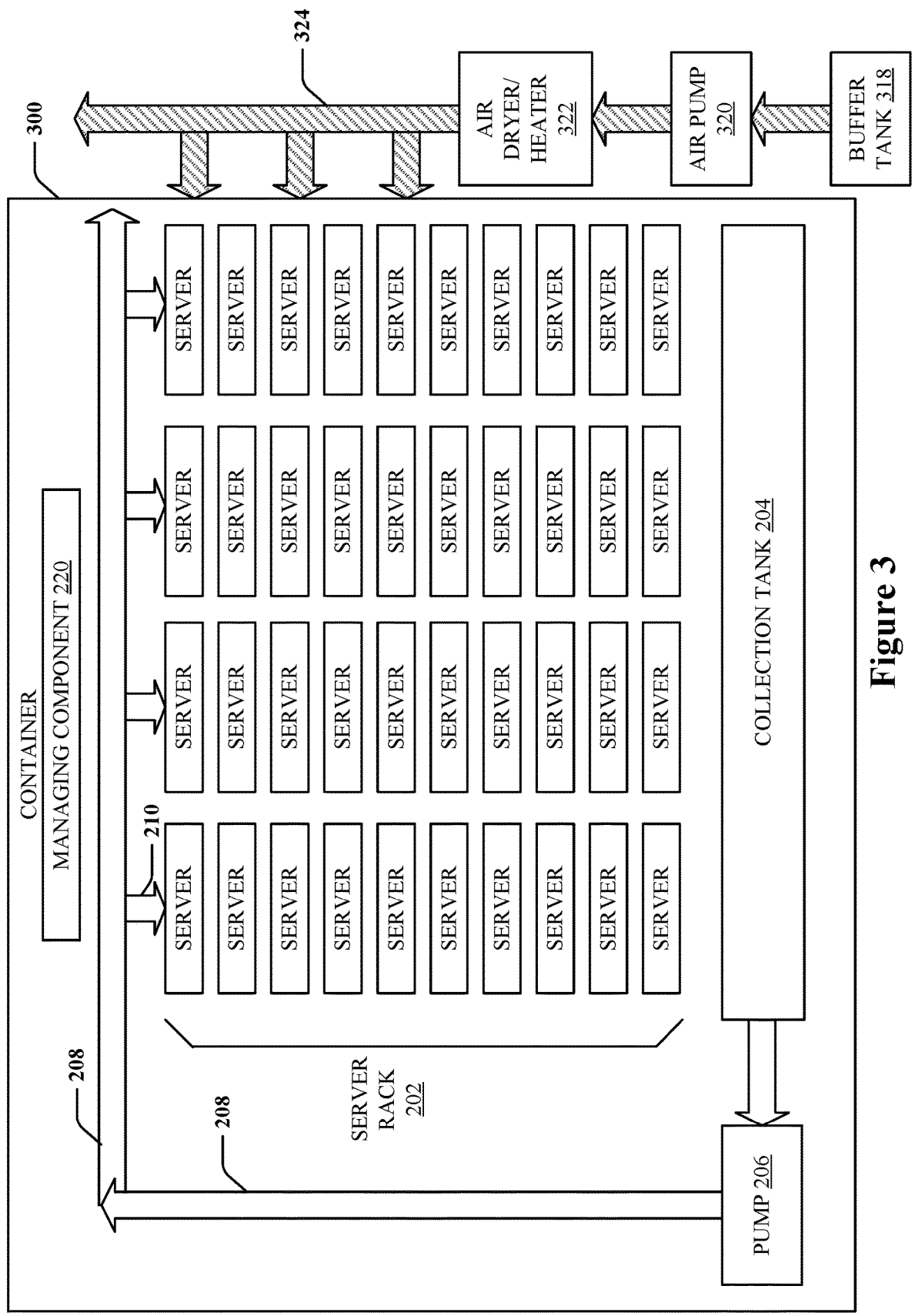
FIG. 3 is a high-level block diagram of an example of a container that houses one or more server racks and an independent air circulation system, in accordance with aspects described herein.
Figure 4:
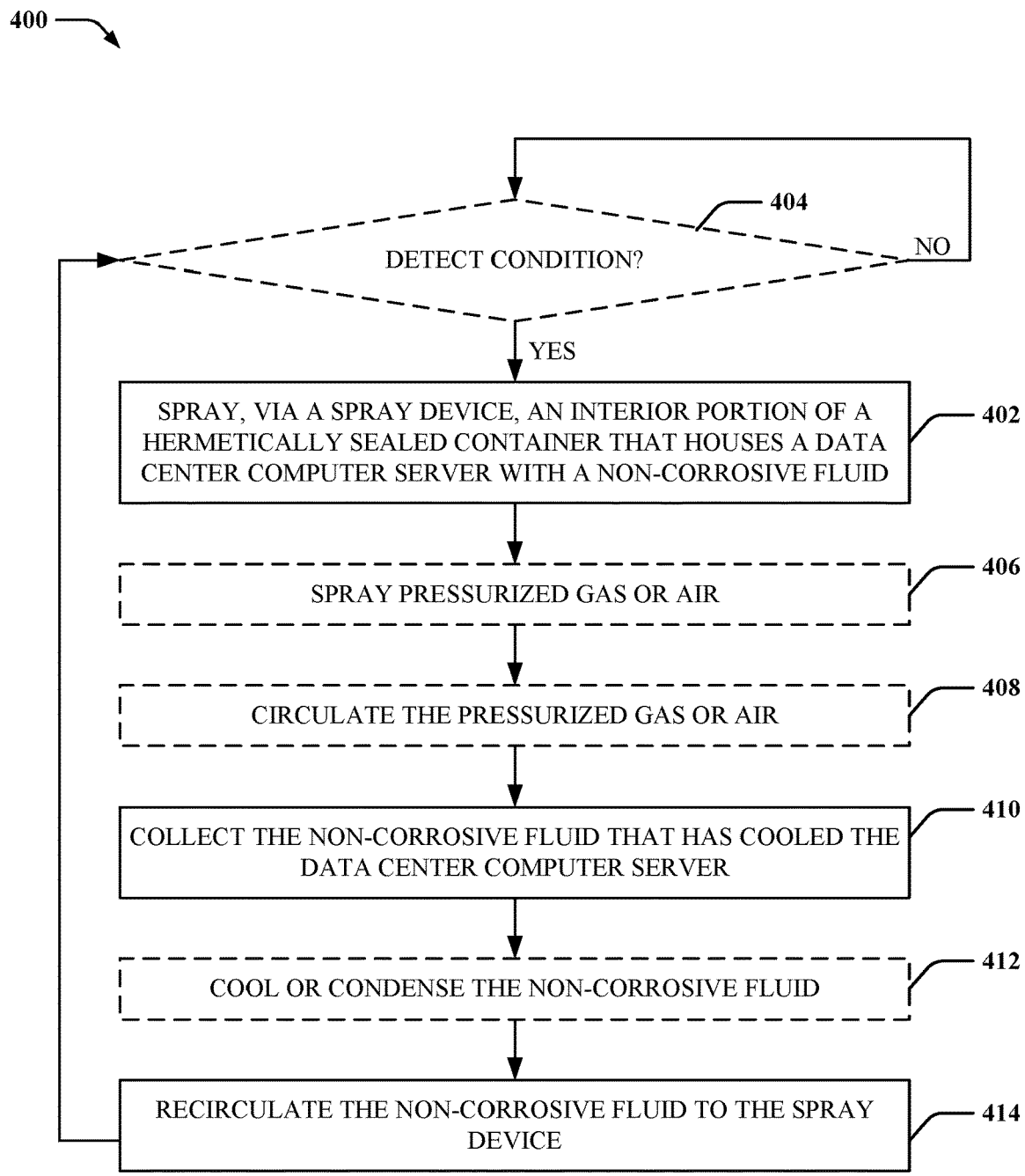
FIG. 4 is a flowchart of an example of a method for cooling data center computer servers.

Turning now to FIGS. 1-4, examples are depicted with reference to one or more components and one or more methods that may perform the actions or operations described herein, where components and/or actions/operations in dashed line may be optional. Although the operations described below in FIG. 4 are presented in a particular order and/or as being performed by an example component, the ordering of the actions and the components performing the actions may be varied, in some examples, depending on the implementation. Moreover, in some examples, one or more of the actions, functions, and/or described components may be performed by a specially programmed processor, a processor executing specially-programmed software or computer-readable media, or by any other combination of a hardware component and/or a software component capable of performing the described actions or functions.

FIG. 1 is a high-level block diagram of an example of one or more computer servers 100 within a container, in accordance with aspects described herein. In an example, one or more computer servers 100 can be located within a container 104. The container 104 can have sides defining an interior portion that houses the computer server(s). The container 104 can be hermetically sealed such that an interior portion of the container 104 may be able to hold gas at certain pressure and/or pressurized air, in accordance with aspects described herein. In one example, the interior portion of container 104 may be able to hold gas at high pressure, which may be greater than a "standard pressure," such as substantially 2 times "standard pressure." Note that atmospheric pressure (also referred to as barometric pressure) is the pressure within the earth's atmosphere of Earth. Generally, atmospheric pressure can be approximated by the hydrostatic pressure caused by the weight of air above a measurement point. Thus, atmospheric pressure decreases as elevation increases (because there is less air above the measurement point). Measured at sea level, the "standard pressure" on earth is approximately 101325 Pascals ("Pa") or 14.7 pounds-per-square-inch ("psi").

The container 104 can also include spray devices 106, which can include sprinklers or other devices that can spray fluid and/or gas, situated around the container. Spraying the fluid and/or gas can include misting the fluid and/or gas. The spray devices 106 can be located on one or more sides of the container 104 (shown on three side in FIG. 1 as one possible example). The spray devices 106 can be positioned to spray fluid and/or gas toward the computer server(s) 100. In accordance with aspects described here, the spray devices 106 can spray a non-corrosive fluid toward the computer server(s) 100, which may include an immersion fluid that can also be used to immerse servers in fluid, as described above. The fluid may include a fluorinated or hydrocarbon-based fluid. Examples of such fluid may include proprietary combinations of substances that form a liquid that can cool computer servers. In addition, the fluid can be of a composition that does not react with air or gas that may also be present within the container 104. In addition, in accordance with examples described herein, spray devices 106 can spray that fluid along with air or any higher conductivity gas.

In an example, the container 104 can include a fluid supply port 108 for receiving the fluid, from a fluid source, collection tank, etc., as described further herein, and providing the fluid to the spray devices 106 for spraying the computer server(s) 100. In some examples, the fluid supply port 108 can be hermetically sealed as well or can otherwise allow for input of fluid without compromising the seal of the container 104. In other examples, described further herein, where the container 104 seals one or more server racks, the fluid supply system and maybe within the container 104, and thus the fluid supply port 108 need not be hermetically sealed. Though not shown in FIG. 1, the fluid supply port 108 can be coupled with supply lines to supply the fluid to each of the spray devices 106. In some examples, the fluid provided via the fluid supply port 108 can be cooled to facilitate cooling the computer server(s) 100 as the fluid is sprayed in the direction of, and comes into contact with, the computer server(s) 100.

In an example, the container 104 can also include a fluid drain port 110 where fluid that is sprayed via the spray devices 106, whether it contacted and cooled the computer server(s) 100 or not, can be collected and drained. In some examples, the fluid drain port 110 can be hermetically sealed as well or can otherwise allow for input of fluid without compromising the seal of the container 104. In other examples, described further herein, where the container 104 seals one or more server racks, the fluid collection system and maybe within the container 104, and thus the fluid drain port 110 need not be hermetically sealed. Though not shown in FIG. 1, the fluid drain port 110 can be coupled with a drain line that can drain the fluid to a collection tank for recirculation, cooling, condensing, etc. of the fluid. In an example, the fluid drain port 110 can be a passive drain that collects the fluid as it flows with gravity to a lowest point in the container 104, and as such the container 104 may be installed at a tilt so the fluid drain port 110 is at a lowest point in the container. In another example, the fluid drain port 110 may be coupled with a pump or other device that can pull fluid from the container 104 and out through the fluid drain port 110.

In an example, the container 104 can include a gas/air supply port 112 for receiving pressurized gas or air (e.g., from a pump), and providing the pressurized gas or air within the container 104. In some examples example, the gas/air supply port 112 can be hermetically sealed as well or can otherwise allow for input of gas or air without compromising the seal of the container 104. In another example, the pressurized gas or air can be provided via the fluid supply port, as mixed with the fluid, for dispensing via the spray devices 106. In either example, the pressurized gas or air can aid in the cooling of the computer server(s) 100 and/or the distribution or collection of the fluid sprayed via spray devices 106. As described, for example, the pressurized gas or fluid can be non-reactive with the fluid. For example, the pressurized air can include nitrogen ($N_2$), oxygen ($O_2$), argon (Ar), carbon dioxide ($CO_2$), etc., or the pressurized gas can include an inert atmosphere and/or a gas that has higher conductivity than air, such as pure $N_2$, $CO_2$, sulfur hexafluoride ($SF_6$), combinations thereof, etc.

In one example, the data center computer server 100 can detect one or more conditions for activating spray devices 106 to spray fluid and/or air or pressurized gas to cool components of the data center computer server 100 or for deactivating the spray devices 106. For example, the data center computer server 100 can detect a temperature of one or more components, or a temperature within container 104, achieving a threshold, e.g., for activating the spray devices 106, or not achieving the threshold, e.g., for deactivating the spray devices 106. In another example, the data center computer server 100 can detect a percentage or amount of processing resources being utilized achieving a threshold, etc., and can activate or deactivate the spray devices 106 based on comparing such values to one or more thresholds. Similarly, in some examples, the data center computer server 100 can determine a spray rate or amount based on comparing such values to one or more thresholds. For example, the data center computer server 10 may detect the one or more conditions using a processor and/or memory to obtain the values and compare the values to the thresholds, as described further herein.

FIG. 2 is a high-level block diagram of an example of a container 200 that houses one or more server racks, in accordance with aspects described herein. In an example, the container 200 can have sides defining an interior portion that houses the one or more server racks 202, where each server rack 202 can include multiple computer servers. The multiple computer servers in the server rack 202 can each be similar to computer server 100, or can be servers without containers. Where the multiple computer servers are similar to computer server 100, each having its own hermetically sealed container, the container 200 may or may not be hermetically sealed. Where the multiple servers are not each hermetically sealed, the container 200 may be hermetically sealed such that an interior portion of the container 200 may be able to hold gas at certain pressure and/or pressurized air, in accordance with aspects described herein.

In an example, the container 200 can include a collection tank 204 for collecting fluid sprayed on the servers, or drained from a container enclosing each server depending on the configuration of the servers in the server rack 202. The container 200 can also include a pump 206 for pumping fluid from the collection tank 204, and/or gas or air, back to the server racks 202 via supply lines 208. The container 200 can include additional supply lines 210 to supply the fluid and/or gas or air to each server rack 202. For example, where the servers are each in a respective container, e.g., as shown in FIG. 1, the container for a server (or multiple servers) may have a fluid drain port 110, as described, which can deliver fluid from the container to the collection tank 204, whether by a passive drain port that can drip fluid into the collection tank, or a drain input to the collection tank (e.g., via a drain line or dripping from the fluid drain port 110), or an active drain system that can pump fluid from the container of the server to the collection tank 204. For example, the pump 206 can receive the fluid from the collection tank 204, e.g., by pulling the fluid from the collection tank 204, and can push the fluid via supply lines 208 and/or 210 to the server rack 202 and/or associated servers.

In another example, the servers in each server rack 202 may not have a respective container or enclosure, other than container 200. In an example, the supply lines 208 can supply the fluid and/or gas or air to one or more spray devices within container 200, which are not shown, that can spray the fluid and/or gas or air on the servers in the server rack 202. In this example, the servers in each server rack 202 may not need enclosures, which can further save cost of sheet metal typically used to provide the enclosures. In such examples, the spray devices in the container 200 may be located per server rack 202 or otherwise in a location pointing towards the server rack 202, such that the server rack 202 can be sprayed with the fluid.

In either example, the collection tank 204 can receive the fluid and/or pressurized gas after it is heated by the servers, and the fluid received in the collection tank 204 can thus be of a hotter temperature than the fluid sprayed on the servers. In an example, collection tank 204 can optionally include a fluid cooler 212 that can cool (e.g., refrigerate or otherwise cool) the fluid in the collection tank 204 to a temperature that is appropriate for spraying the servers to have a cooling effect (e.g., in conjunction with the pressurized gas or air, or otherwise). In another example, collection tank 204 can optionally include a condenser 214 that can remove vapor from the fluid (e.g., where the fluid is a two-phase fluid). For example, heat from the servers can cause the fluid to boil, which can produce the vapor that rises from the liquid stored in collection tank 204. The condenser 214 can condense the vapor, and transfer the heat out of the container 200. In other examples, cooling of the fluid can occur using conduction, convection, phase change, etc.

In some examples, the collection tank 204 may include a fluid strainer 216 for straining impurities from the fluid collected at the collection tank 204. In addition, in some examples, the collection tank 204 can include a gas purifier 218 (or trap), which can be a mechanical or chemical mechanism to eliminate contaminants and moisture, and/or the like, from the pressurized gas or air before being pumped back to the server racks 202. The pump 206 can pump the cooled or purified fluid, and/or gas or air, back to the server racks 202, as described.

In an example, a managing component 220 can be provided for managing operation of one or more of the components in the container 200, such as pump 206, spray devices 106 (e.g., in the container 200 or in each server), etc. For example, managing component 220 can be configured to detect one or more conditions for activating or deactivating spray devices 106 to spray the servers in server rack 202, determining a spray rate for the spray devices 106, determining a mixture of fluid and gas, etc., as described in conjunction with the data center computer server 100 above. In this regard, managing component 220 can include or be coupled to a device with a processor and/or memory for obtaining values for comparing to one or more thresholds, for performing the comparison, for operating the spray devices 106, pump 206, etc., and/or the like.

In some examples, the collection tank 204 can be placed inside the rack to support multiple data center computer servers 100 or located on a row level with larger reservoirs to support multiple server racks 220 with many containers. In addition, where the collection tank 204 is near a floor of the room or of the container 200, the bottom part of the container 200, via the collection tank 204, can provide some immersion cooling to baseboards based on the designed fluid retention height and drainage ratio of the dripping spray. In some examples, managing component 220 can control the drainage ratio (e.g., how much fluid is sprayed via spraying devices and how much fluid returns to the collection tank 204) based on the level of desired immersion height for lower components (e.g., if so desired).

FIG. 3 is a high-level block diagram of an example of a container 300 that houses one or more server racks and an independent air circulation system, in accordance with aspects described herein. In an example, the container 300 can have sides defining an interior portion that houses the one or more server racks 202, a collection tank 204, a pump 206, supply lines 208 and/or 210, etc., as described in reference to FIG. 2 above. In addition, an air circulation system is shown that can include one or more of a buffer tank 318 for storing pressurized gas at a dispensing pressure, an air pump 320 to pump the pressurized gas into the container 300. In another example, the air pump 320 can pump air (e.g., CO2) to an air dryer/heater 322, which can dry the air to achieve a higher pressure and improve the conductivity, and can provide the air to the container 300 via supply lines 324, or to the spray devices as described above. In an example, the air pump 320, air dryer/heater 322, and/or supply lines 324 can be located outside of the container 300, as shown, or the supply lines 324 can be coupled to the container 300 via one or more ports to blow air into the container 300. In another example, the supply lines 324 can be coupled to an input port on each server rack 202 and/or another port that can be coupled with a gas/air supply port 112 of a container 104 for one or more servers, supply lines 208, etc. to blow air directly into the gas/air supply ports 112 (e.g., along with fluid sprayed via spray devices 106 or otherwise blown into the container 104, 200, or 300). In another example, air pump 320, air dryer/heater 322, and/or supply lines 324 can be located within the container 300, such that the air can be collected, dried and/or heated, and recirculated throughout the container 300. In some examples, the buffer tank 318, air pump 320, and/or air dryer/heater 322 can be placed inside the rack to support multiple data center computer servers 100 or located on a row level with larger reservoirs to support multiple server racks 220 with many containers.

In an example, a managing component 220 can be provided for managing operation of one or more of the components in the container 300, such as pump 206, air pump 320, air dryer/heater 322, spray devices 106 (e.g., in the container 300 or in each server), etc. For example, managing component 220 can be configured to detect one or more conditions for activating spray devices 106 to spray the servers in server rack 202, determining a spray rate for the spray devices 106, determining a mixture of fluid and gas, etc., as described in conjunction with the data center computer server 100 above. In another example, example, managing component 220 can be configured to detect one or more conditions for activating or deactivating air pump 320 to provide air into the container 300 (e.g., via spray devices 106 or otherwise), to dry and/or heat the air via air dryer/heater 322, etc., such as a pressure in the container 300 achieving or not achieving a threshold In this regard, managing component 220 can include or be coupled to a device with a processor and/or memory for obtaining values for comparing to one or more thresholds, for performing the comparison, for operating the spray devices 106, pump 206, air pump 320, air dryer/heater 322, etc., and/or the like.

FIG. 4 is a flowchart of an example of a method 400 for cooling data center computer servers, in accordance with aspects described herein. For example, method 400 can be performed by one or more components described in the Figures above and/or by one or more processors that operate the one or more components based on received instructions (e.g., instructions stored in a memory).

In method 400, at action 402, an interior portion of a hermetically sealed container that houses a data center computer server can be sprayed, via a spray device, with a non-corrosive fluid. In an example, spray device 106 can spray the interior portion of the hermetically sealed container 104, 200, or 300 that houses a data center computer server (or multiple data center computer servers) with a non-corrosive fluid. For example, spray device 106 can spray within the interior portion of the container or otherwise spray the data center computer server directly. The spray device 106 can continually spray or can spray according to a time schedule or can spray based on heat detected within the container 104, 200, or 300 or on the server or servers triggering the spraying, etc. In addition, for example, spray device 106 can control an amount of fluid sprayed based on heat detected within the container 104, 200, or 300 or on the server or servers triggering the spraying, etc.

In method 400, optionally at action 404, it can be determined whether a condition is detected (e.g., a condition to spray fluid and/or pressurized gas or air for a data center computer server). In an example, data center computer server 100, managing component 220, etc., via a processor, memory, and/or the like, can determine whether the condition to spray fluid and/or pressurized gas or air for the data center computer server is detected. For example, this can include spraying within the data center computer server 100 via spray devices 106, spraying within container 200 or 300 (e.g., spraying servers in server rack 202), etc. The condition, as described here, can include a condition related to detecting a temperature with the container or data center computer server, etc., a pressure within the container or data center computer server, etc. If the condition is detected (or while the condition is detected), spray devices 106 can be used to spray the data center computer server 100, container 200 or 300, etc.

In method 400, optionally at action 406, pressurized gas or air can also be sprayed. In an example, spray device 106 can spray the pressurized gas or air in addition to the fluid, such as in a mixture of fluid and gas or air, alternating spraying of fluid and gas or air, etc. Similarly, spray device 106 can continuously spray the pressurized gas or air or do so according to a time schedule or based on heat detected, etc.

In method 400, optionally at action 408, the pressurized gas or air can be circulated. In an example, air pump 320 or air dryer/heater 322 can circulate the pressurized gas or air, as described. For example, air dryer/heater 322 can heat or dry the air to a higher pressure before circulating via supply lines 324. In one example, air pump 320 or air dryer/heater 322 can supply the pressurized gas or air to the data center computer servers via supply lines 324 and/or gas/air supply port 112, etc.

In method 400, at action 410, the non-corrosive fluid that has cooled the data center computer server can be collected. In an example, a collection tank 204 can be used to collect the non-corrosive fluid that has cooled the data center computer server (or multiple servers). As described, for example, this collection of the non-corrosive fluid can occur via gravity by the fluid dripping or running off of the data center computer server(s), via fluid drain port 110 or otherwise, and into the collection tank 204. In another example, as described, this collection of the non-corrosive fluid can occur via a pump that pumps the fluid drained from a container to the collection tank 204, etc.

In method 400, optionally at action 412, the non-corrosive fluid can be cooled or condensed. In an example, the collection tank 204, or a fluid cooler 212 or condenser 214 thereof, can cool or condense the non-corrosive fluid as described. For example, cooling can occur or be effectuated using one or more of conduction, convection, or phase change, etc.

In method 400, at action 414, the non-corrosive fluid can be recirculated to the spray device. In an example, the pump 206 can recirculate the non-corrosive fluid to the spray device(s) 106. For example, the pump 206 can supply the non-corrosive fluid from the collection tank 204 to the spray device(s) 106 via supply lines 208 or 210, fluid supply port 108, etc.

In some examples, the method can proceed from action 414 back to action 404 to determine whether condition is still detected. Thus, for example, while the condition exists, e.g., while comparing the temperature or pressure to a threshold indicates to activate spray devices, the spray devices can continue to spray fluid and/or pressurized gas or air, as described. When the condition is not detected, e.g., when comparing the temperature or pressure to a threshold does not indicate to spray the servers or containers, such as when the temperature falls below the threshold or a threshold pressure is achieved, the spray devices 106 can be shutoff (e.g., at least until the condition is detected again).

Figure 5:
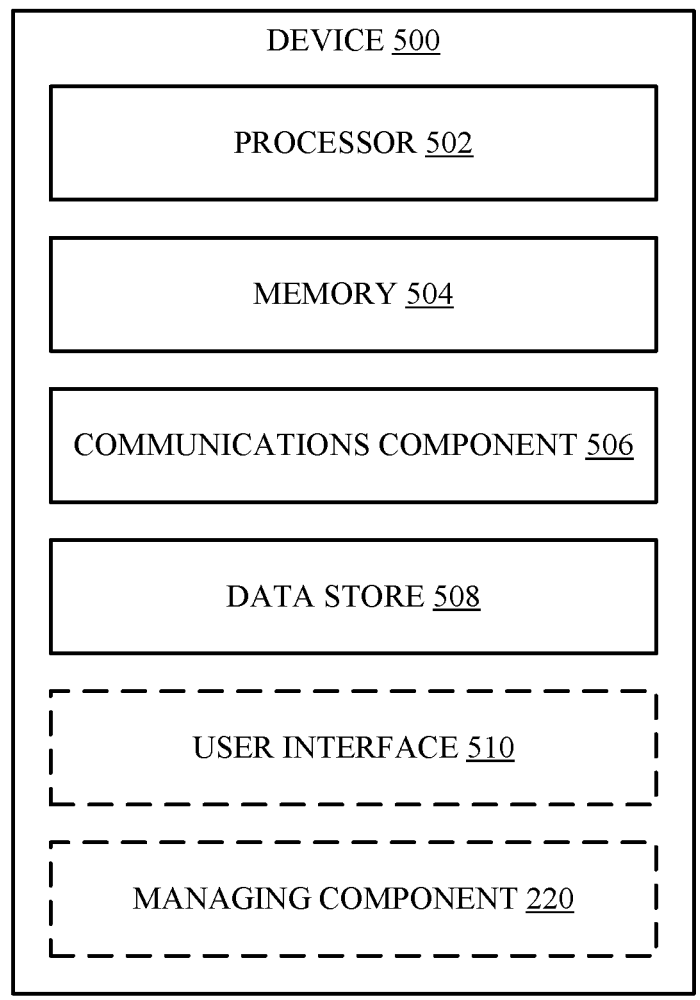
FIG. 5 is a schematic diagram of an example of a device for performing functions described herein, in accordance with aspects described herein.

FIG. 5 illustrates an example of device 500 that may be used in conjunction with aspects described herein. For example, device 500 can represent a data center computer server 100, as described herein. In this regard, for example, the data center computer server 100 can include one or more components of, or similar to, device 500 to provide computerized functionality, such as executing instructions stored in memory 504 via a processor 502, etc. In another example, device 500 can be used to provide or manage a cooling system having one or more of the components described herein, such as spray devices 106, pumps 206 and 320, air dryer/heater 322, etc.

In one aspect, device 500 may include processor 502, which may be similar to processor 102 for carrying out processing functions associated with one or more of components and functions described herein. Processor 502 can include a single or multiple set of processors or multi-core processors. Moreover, processor 502 can be implemented as an integrated processing system and/or a distributed processing system.

Device 500 may further include memory 504 for storing local versions of operating systems (or components thereof) and/or applications or instructions being executed by processor 502. Memory 504 can include a type of memory usable by a computer, such as random-access memory (RAM), read only memory (ROM), tapes, magnetic discs, optical discs, volatile memory, non-volatile memory, and any combination thereof.

Further, device 500 may include a communications component 506 that provides for establishing and maintaining communications with one or more other devices, parties, entities, etc. utilizing hardware, software, and services as described herein. Communications component 506 may carry communications between components on device 500, as well as between device 500 and external devices, such as devices located across a communications network and/or devices serially or locally connected to device 500. For example, communications component 506 may include one or more buses, and may further include transmit chain components and receive chain components associated with a wireless or wired transmitter and receiver, respectively, operable for interfacing with external devices.

Additionally, device 500 may include a data store 508, which can be any suitable combination of hardware and/or software, which provides for mass storage of information, databases, and programs employed in connection with aspects described herein. For example, data store 508 may be or may include a data repository for operating systems (or components thereof), applications, related parameters, etc. not currently being executed by processor 502.

Device 500 may optionally include a user interface component 510 operable to receive inputs from a user of device 500 and further operable to generate outputs for presentation to the user. User interface component 510 may include one or more input devices, including but not limited to a keyboard, a number pad, a mouse, a touch-sensitive display, a navigation key, a function key, a microphone, a voice recognition component, a gesture recognition component, a depth sensor, a gaze tracking sensor, a switch/button, any other mechanism capable of receiving an input from a user, or any combination thereof. Further, user interface component 510 may include one or more output devices, including but not limited to a display, a speaker, a haptic feedback mechanism, a printer, any other mechanism capable of presenting an output to a user, or any combination thereof.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more aspects, one or more of the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices such as hard disk drives, flash solid state drives (SSDs), tape media drives, etc., or any other medium that can be used to carry or store desired program code in the form of instructions or data structures and that can be accessed by a computer. Disk and disc, as used herein, includes compact disc (CD), laser disc, optical disc, digital versatile disc (DVD), and floppy disk where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described herein that are known or later come to be known to those of ordinary skill in the art are expressly included and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A system for improving heat transfer for a data center, comprising:
   a hermetically sealed container having sides defining an interior portion that is able to hold pressurized gas or air, wherein the hermetically sealed container encloses multiple data center computer servers within the interior portion, including a data center computer server; and
   a spray device located within the interior portion for spraying a non-corrosive fluid in conjunction with pressurized gas or air over the data center computer server, located within the interior portion, to cool at least a portion of the data center computer server, wherein multiple spray devices are located on a side of each of the hermetically sealed container.

2. The system of claim 1, further comprising one or more supply lines for supplying the non-corrosive fluid from a fluid source or pump to a fluid supply port in a housing of the data center computer server.

3. The system of claim 1, further comprising:
   a collection tank located within or outside of the hermetically sealed container that collects the non-corrosive fluid that runs off of the data center computer server; and
   a pump to pump the collected non-corrosive fluid to the spray device.

4. The system of claim 3, further comprising a cooling or condensing system for removing heat from the collected non-corrosive fluid before providing to the pump for pumping to the spray device.

5. The system of claim 3, further comprising a fluid strainer to strain contaminants from the non-corrosive fluid before the pump pumps the non-corrosive fluid to the spray device.

6. The system of claim 1, further comprising an air pump to circulate the pressurized gas or air within the hermetically sealed container.

7. The system of claim 6, further comprising a buffer tank for storing the pressurized gas at a dispensing pressure, wherein the air pump pumps the pressurized gas from the buffer tank to the multiple spray devices.

8. The system of claim 6, further comprising a heating or drying system to heat or dry the air to a higher pressure before providing to the air pump for circulation.

9. The system of claim 6, further comprising a gas purifier for eliminating moisture from the pressurized gas.

10. The system of claim 1, wherein the non-corrosive fluid is a fluorinated or hydrocarbon-based fluid.

11. The system of claim 1, wherein the pressurized gas or air is nitrogen (N2), oxygen (O2), argon (Ar), carbon dioxide (CO2), or sulfur hexafluoride (SF6).

12. A method for improving heat transfer for a data center, comprising:
   spraying, via a spray device, an interior portion of a hermetically sealed container that houses a data center computer server with a non-corrosive fluid in conjunction with pressurized gas or air to cool at least a portion of the data center computer server, including spraying multiple data center computer servers located in the interior portion of the hermetically sealed container;
   collecting the non-corrosive fluid that has cooled the data center computer server; and
   recirculating the non-corrosive fluid to the spray device.

13. The method of claim 12, wherein recirculating the non-corrosive fluid includes pumping the non-corrosive fluid to an input port associated with the data center computer server.

14. The method of claim 12, further comprising cooling or condensing the collected non-corrosive fluid before recirculating.

15. The method of claim 12, further comprising pumping, from a collection tank located within or outside of the hermetically sealed container for collecting the non-corrosive fluid that runs off of the data center computer server, collected non-corrosive fluid to the spray device.

16. The method of claim 12, further comprising pumping, from a buffer tank for storing the pressurized gas at a dispensing pressure, the pressurized gas to the spray device.

17. The method of claim 12, wherein the non-corrosive fluid is a fluorinated or hydrocarbon-based fluid, and wherein the pressurized gas or air is nitrogen (N2), oxygen (O2), argon (Ar), carbon dioxide (CO2), or sulfur hexafluoride (SF6).

* * * * *